United States Patent [19]
Devin

[11] Patent Number: 5,579,265
[45] Date of Patent: Nov. 26, 1996

[54] MEMORY REDUNDANCY CIRCUIT

[75] Inventor: Jean Devin, Aix-en-Provence, France

[73] Assignee: SGS-Thomson Microelectronics S.A., Saint-Genis, France

[21] Appl. No.: 393,464

[22] Filed: Feb. 27, 1995

[30] Foreign Application Priority Data

Feb. 28, 1994 [FR] France ..................... 94 02282

[51] Int. Cl.⁶ .................. G11C 7/00; G11C 29/00
[52] U.S. Cl. .................. 365/200; 365/201; 365/195; 365/226; 371/21.1
[58] Field of Search ................... 365/200, 201, 365/49, 189.02, 189.07, 230.01, 230.02, 230.03, 195, 226; 371/10.1

[56] References Cited

U.S. PATENT DOCUMENTS

| | | | |
|---|---|---|---|
| 4,744,060 | 5/1988 | Okajima | 365/200 |
| 4,858,192 | 8/1989 | Tatsumi et al. | 365/200 |
| 5,113,371 | 5/1992 | Hamada | 365/200 |
| 5,347,484 | 9/1994 | Kwong et al. | 365/200 |
| 5,381,370 | 1/1995 | Lacey et al. | 365/200 |
| 5,438,546 | 8/1995 | Ishac et al. | 365/200 |

FOREIGN PATENT DOCUMENTS 0410413  1/1991  European Pat. Off. ........ G11C 29/00

*Primary Examiner*—David C. Nelms
*Assistant Examiner*—Trong Phan
*Attorney, Agent, or Firm*—David M. Driscoll; James H. Morris

[57] ABSTRACT

The disclosure pertains to a memory redundancy circuit. A main memory may, if there should be defective zones (defective columns for example), be replaced by a redundancy memory. A defective address memory is initialized during the testing of the main memory. During normal operation relating to access to the main memory, each main memory address is compared with all the defective addresses to replace the zone of the main memory with a redundancy memory. During the testing of the main memory, it is generally necessary to initialize each address of the defective address memory. This causes time to be lost if the main memory is fault-free. The disclosure provides for an inhibition circuit that can be used to put the defective address memory out of service or to make its operation ineffective, and to do so permanently. Application to integrated circuit memories.

15 Claims, 4 Drawing Sheets

MEMORY REDUNDANCY CIRCUIT

BACKGROUND OF THE INVENTION

1. Field of the Invention

The invention relates to a memory redundancy circuit applicable notably to memories made in integrated circuit form.

2. Discussion of the Related Art

There is then a known way, in the memory addressing technique, of replacing a part (column) of a main memory, when it proves to be defective, by a backup memory or redundancy memory.

In a standard way, a main memory is organized in rows and columns. To cope with the defects detected in the rows or columns, provision is made for redundancy rows or redundancy columns respectively.

For example, if a column of the main memory is defective, it is replaced by a redundancy column as follows: the address of the defective column is memorized in a defective address memory; this defective address memory is a memory of the content addressable type, known as a Content Addressable Memory (CAM); whenever an address is applied to the main memory, this address is also applied to the CAM. If the applied address is identical to the memorized address, the redundancy circuit is put into operation and acts to disconnect the defective column and connect, in its place, a redundancy column in a manner that is invisible to the user.

In practice, depending on the organization of the main memory, if a column is defective, it is rather a group of columns containing this defective column that is replaced by a group of redundancy columns: in general, if a group of columns is defined by an address bit of the large-capacity memory, it is this group of columns that will be replaced as a whole. Hereinafter, for purposes of simplification, the description shall be limited to the replacing of a column rather than the replacing of a group of columns.

For a main memory of several megabits, there is provision for the possibility of repairing several defects; there are therefore as many redundancy columns as there are defective columns or rows that are to be repaired. With each redundancy column, there is associated a respective CAM containing the address of a defective column. If it is desired to repair N defective columns, there should be N redundancy columns and N CAMs. Typically, N=36 for a 4-megabit or 16-megabit memory.

If a column of the main memory is designated by an M-bit address (for example M=5), each CAM contains at least M+1 bits: M bits to define the address of a defective column and one enabling bit to indicate that the redundancy circuit corresponding to this CAM must effectively be activated when the defective address is applied to the CAM.

During the testing of a main memory and the detection of defects, it is therefore necessary to appropriately record CAMs so that, during subsequent attempts to use defective parts of the main memory, these CAMs will automatically replace the defective parts of the main memory by the redundancy memory. However, in certain systems, the CAMs are formed by memory cells comprising complementary memory cells. Depending on whether a one or a zero is recorded in such an element, one memory cell or the other of the element has to be programmed. Consequently, all the elements have to be programmed, whether they are used or not. For, when there is no programming, there is a risk that these CAMs will nevertheless wrongly give an information element (a defective address information element). Various means can be envisaged to make it possible to find out if a CAM has to be used or not.

It is possible, for example, to provide for an enabling bit associated with each CAM to indicate whether this CAM is used or not. However, this makes it necessary, during the test, to position these means, in this case the enable bit of each CAM, in the position corresponding to the use or non-use of each CAM. This therefore makes it necessary, all the same, to have an additional testing time when these CAMs are initialized. The aim of the invention is to prevent, in certain cases, the operations for the initialization of the CAMs and, consequently, to reduce this initialization time. Notably, should no defect be detected in a main memory, no CAM has to be used and it is possible to comprehensively process all the CAMs relating to this main memory. To this end, in the invention, there is added an additional memory element which, by its state, gives information about whether or not the state of the CAMs should be considered. It is shown that there is thus an average gain of 3 seconds for the testing of each memory: this is very significant.

SUMMARY OF THE INVENTION

The invention therefore relates to a memory redundancy circuit for a main memory comprising several memory zones, each accessible by a memory address, this redundancy circuit comprising a redundancy memory addressable by a defective address memory that is designed to contain different defective addresses corresponding to defective zones of the main memory and that, at each operation for the addressing of the main memory, compares the main memory address with each defective address so that, in the event of concordance, it prohibits the addressing of the main memory and addresses a zone of the redundancy memory, wherein said redundancy circuit comprises an inhibition circuit having at least one first state in which it gives an inhibition signal to the defective address memory to prohibit its operation or make it ineffective.

The invention also relates to a method for the initialization of a main memory that is provided with a redundancy memory accessible by means of a circuit of defective addresses, according to which a test of the main memory is carried out, wherein if no defect is detected in the main memory, the working of the circuit of defective addresses is made ineffective.

To make the CAMs, groups of physical fuses were first used, these fuses being electrically blown or blown by a laser beam, each fuse representing an address bit or an enable bit. These fuses had drawbacks (in terms of reliability, space requirement, consumption and difficulty of programming) and were soon replaced by non-erasable, non-volatile memory cells. The latter also had drawbacks (high current consumption) and there was a gradual turning towards the use of programmable bistable flip-flop circuits comprising two floating-gate transistors for each address bit or enable bit.

FIG. 1 shows a prior art non-volatile programmable bistable flip-flop circuit constituting a cell for the memorization of a defective address bit (or an enable bit) and therefore constituting one of the M+1 cells of a defective address CAM.

The output OUT of this cell is at a logic level 0 or at 1 depending on the state in which the flip-flop circuit is programmed. This output therefore defines the value of an address bit (or the value of the enable bit).

If the cell corresponds to one of the M defective address bits, the output of each cell of these M address bits is applied to an Exclusive-OR gate (not shown). The Exclusive-OR gate receives, at another input, a corresponding address bit received by the main memory. The outputs of the Exclusive-OR gates corresponding to the different address bits of one and the same defective memory are applied to an input of a NOR gate (not shown). The output of this NOR gate gives a logic level 1 solely if there is coincidence between all the address bits applied and all the corresponding bits of the defective memory. The output of the NOR gate is enabled by the output of the memory cell corresponding to the enable bit, for example by means of an AND gate (not shown). The output of the AND gate is the output of the CAM and is used to put a redundancy path into operation whenever the address applied to the main memory corresponds to the defective address recorded.

In general, there are N defective address memories, for example N=36. During the testing of the main memory, the detection of a defective column triggers the storage of the address of this column in one of the CAMs. The different CAMs are thus successively programmed as and when the defects are detected. In normal operation of the main memory, the addresses of this memory are applied simultaneously to all the CAMs. If there is a correspondence of the address applied and of the address stored in one of them, the redundancy path corresponding to this address is activated.

To enable the programming of a defective address in a CAM, it is therefore provided that a respective address bit of the main memory will be applied to each cell of the CAM. The programming is done upon a command from the testing machine in the event of the detection of a defect at the address being tested.

The individual memory cell shown in FIG. 1 has two arms with a floating gate transistor TGF1, TFG2 in each arm. The arms are arranged so as to form a bistable flip-flop circuit as soon as one of these two transistors is programmed. The state of the flip-flop circuit, represented by the output OUT and corresponding to an address bit or an enable bit is then a function of that one of the two transistors which is programmed. At the outset, the two transistors are in a non-programmed state or blank state. During the testing of the memory, one of the two transistors is programmed to obtain either a 0 or a 1 at output OUT of the cell, thus defining a permanent stable state 0 or 1 of the cell.

More specifically, the cell of FIG. 1 has two identical arms parallel-connected between a supply terminal A (potential Vcc of the order of 3 volts) and a terminal B. The terminal B is at a potential VS that is null in read mode or programming mode and may also be carried to a high potential VS (12 volts) in erasure mode if an erasure mode is planned (flash EPROM). In series in each arm, there is a P channel transistor (T1, T2), an N channel transistor (T3, T4), and a floating-gate transistor (TGF1, TGF2). The gate of the P channel transistor (T1, T2) of one of the arms is connected to the drain of the P channel transistor (T2, T1) of the other arm. The gates of the N channel transistors (T3, T4) are connected together to a common potential VB whose value depends on the mode of operation (about 1.8 volts in read mode; 0 volts in programming or erasure mode to have 1 volt on the drain of the cells in read mode). The transistors T3 and T4 are insulation transistors to prevent the transmission, to the transistors T1 and T2, of the relatively high voltages applied to the floating-gate transistors in programming or erasure mode. The gates of the floating-gate transistors TGF1, TGF2, are connected to a common potential VGF depending on the operation (about 3 volts in read mode, about 12 volts in programming). The source of these transistors is connected to the node B (potential VS). The drain potentials of the floating-gate transistors are controlled by transistors T5 and T6 respectively, enabling either the connection of the drain to a programming potential VPRG (with transistor T5 or T6 conductor) or the leaving of the drain in a state of high impedance (transistor T5 or T6 off). In programming mode, the gate of the transistor T5 is controlled by a programming signal PROG and the gate of the transistor T6 by a complementary signal NPROG. Consequently, a choice is made, depending on the state of the signal PROG, of that one of the two floating-gate transistors which should be programmed and that one which should remain blank. In reading mode, the drain of the transistors T5 and T6 remains in a state of high impedance, the voltage VPRG being not applied to these drains.

The cell is called bistable because it has one stable state among two possible stable states, stable state that it takes depending on that one of the two transistors that has been programmed. The state of the cell is read on the drain of one of the P channel transistors (T2 for example). This drain is connected to the input of a first inverter INV1 followed by a second inverter INV2. The output of INV2 is the output OUT of the cell. The output INV1 is used as a complementary output NOUT if there is need thereof. Finally, a supplementary transistor T7 may be used, solely in testing mode, to prevent the floating nodes, when T3 and T4 are off, from temporarily grounding the input of the inverter INV1 (for an initialization of the state of the cell at each power-on-reset operation). The gate of this transistor is controlled by an initialization square-wave signal INIT produced by a standard power-on-reset circuit (not shown).

The invention can be applied to a system comprising CAMs of the type shown in FIG. 1.

The invention can therefore also be applied to a redundancy circuit in which the defective address memory has two floating-gate transistors of the type forming a bistable circuit whose state is defined by the programming of one of the transistors and is indicated by the state of an output connected to the drain (or to the source) of one of the transistors. This output is connected to a comparison circuit which furthermore receives a main memory address information element and gives an identity signal in the event of equality of the main memory address element and of the contents of the defective address memory. A coincidence circuit has its inputs connected to several comparison circuit outputs to give a signal in the event of an identity of memory addresses. Furthermore, this coincidence circuit has an additional input to receive an enable signal or the reverse of an inhibition signal.

BRIEF DESCRIPTION OF THE DRAWINGS

The different objects and characteristics of the invention shall appear more clearly from the following description and from the appended figures of which.

DETAILED DESCRIPTION

Figure 2:
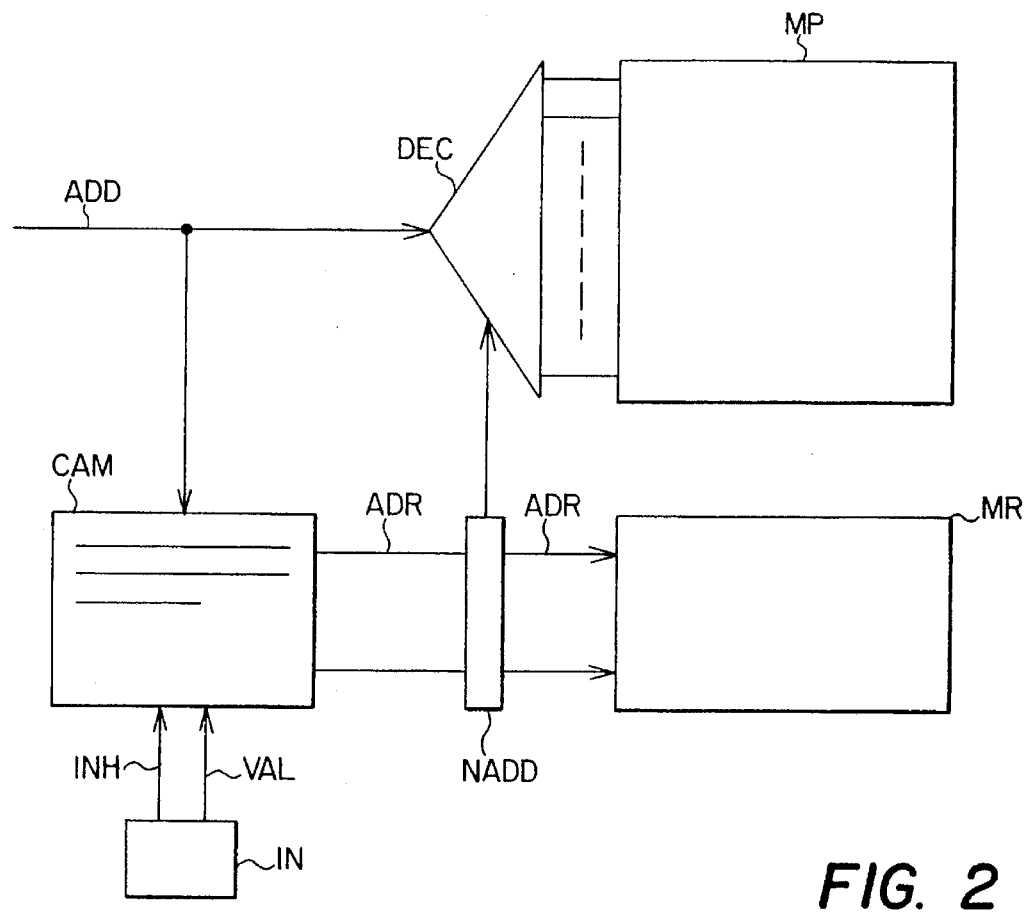
FIG. 2 shows a general diagram of the circuit according to the invention.

Referring to FIG. 2, a description shall be given first of all of a simplified exemplary embodiment of the device according to the invention.

A main memory MP has a large number of memory zones not shown in detail in the figure. These zones can be arranged in a standard way in rows and columns. Each zone is selected (or addressed) by means of an addressing device DEC (or address decoder). The addressing device DEC receives an address ADD and enables access to a particular zone of the main memory MP. One or more zones may be found to be defective. They have to be replaced by standby zones which are what will be called a redundancy memory MR.

The zones of the main memory MP which are detected as being defective have their address, which shall be called a defective address for purposes of simplification, memorized in a memory such as a CAM described here above.

According to the invention, if the entire main memory MP, for example, is fault-free, the CAM does not have to be used. For this purpose, an inhibition circuit IN is put into a situation such that it deactivates the operation of the CAM by sending it a signal INH. If this signal is not transmitted, it means that the CAM may be used. For example, an enable signal VAL is given by the circuit IN. When an address ADD is then transmitted to the decoder DEC, it is also transmitted to the CAM which compares the address ADD with all the defective addresses that it has memorized. In the event of concordance, the CAM delivers a signal ADR to prevent the addressing of the address memory zone ADD in the main memory and, instead, to bring about the addressing of a zone of the redundancy memory MR. This can be done by any means compatible with the addressing means of the main memory MP. In FIG. 2, in a simplified way, a circuit NADD, in the event of such a concordance, gives a signal to the decoder DEC to prevent it from addressing the memory MP.

Conversely, if the circuit IN gives the inhibition signal INH instead of the enable signal VAL, the comparison of addresses (i.e. comparison of the main memory address and the defective addresses) cannot be done or is made ineffective and the addressing of the memory MP can be done normally.

Figure 3:
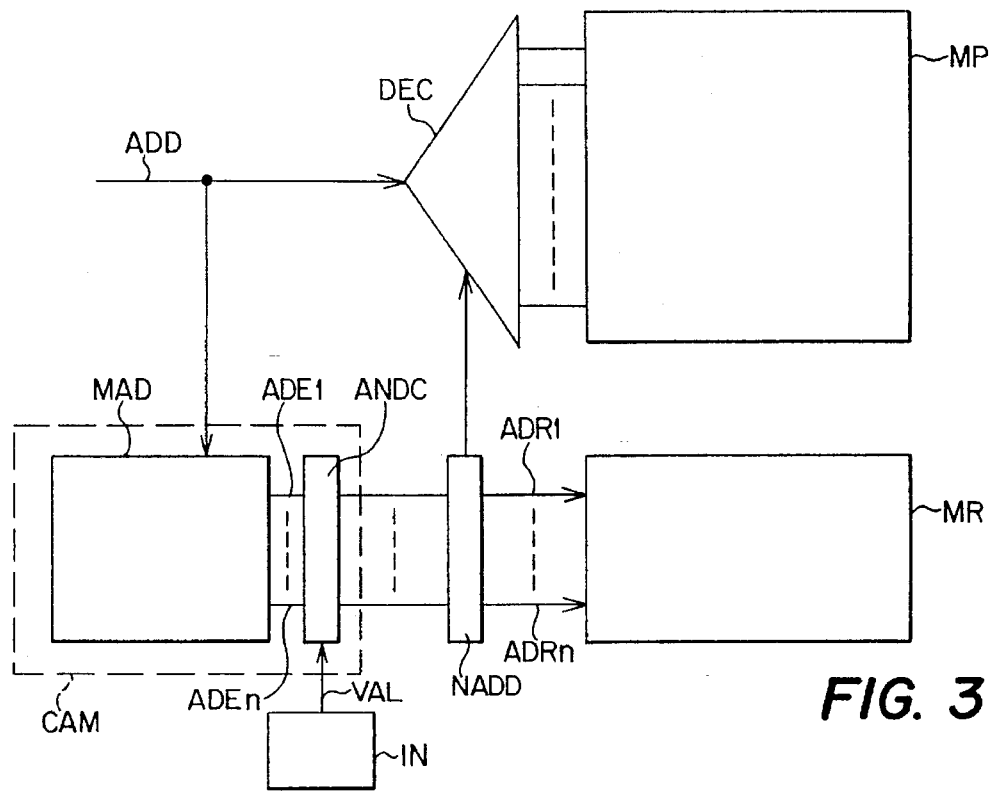
FIGS. 3 to 5 exemplify an embodiment in which the circuit of the invention comes into play in the working of the comparison circuit of a main memory address and a defective memory address.

FIG. 3 shows an embodiment of the device of FIG. 2. The defective address memory MAD itself has been shown as being separated from an AND coincidence circuit ANDC making it possible to ensure that the different address bits ADD are identical with the address bits contained in the memory MAD. Whenever an address ADD is received, this address is compared with the different addresses ADE1 to ADEn contained in the memory MAD by carrying out Exclusive-OR operations on the different address bits. In the event of identity in a comparison, the ANDC circuit gives a signal ADR1 to ADRn in order, firstly, to prohibit the addressing of the memory MP at the address ADD and, secondly, to address a zone of the redundancy memory MR. This operation is possible when there is no inhibition signal INH, (not shown in FIG. 3) or if an enable signal VAL (see above) is given to the ANDC circuit.

Figure 4:
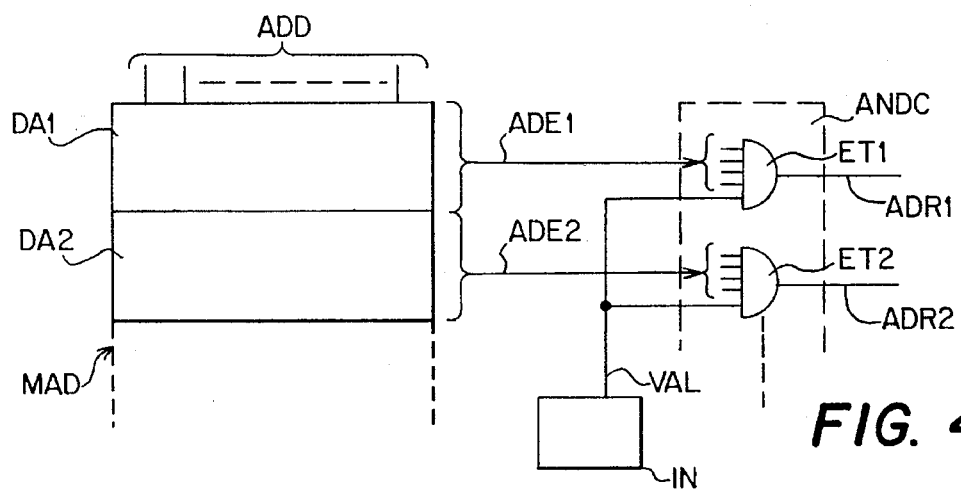

By contrast, if the inhibition circuit IN gives an inhibition signal (or does not give the foregoing enable signal VAL), the ANDC circuit cannot give the address signal ADR1 to ADRm and the addressing of the main memory is done normally. As shown in FIG. 4, the AND type logic circuit comprises one coincidence circuit referenced ET1, ET2, per defective address DA1, DA2 given by the memory MAD, According to the embodiment of FIG. 4, it is not the signal INH that is given to an input of each circuit ET1, ET2 but a reverse signal VAL enabling the operation of the circuits ET1, ET2 in AND type coincidence.

Figure 5:
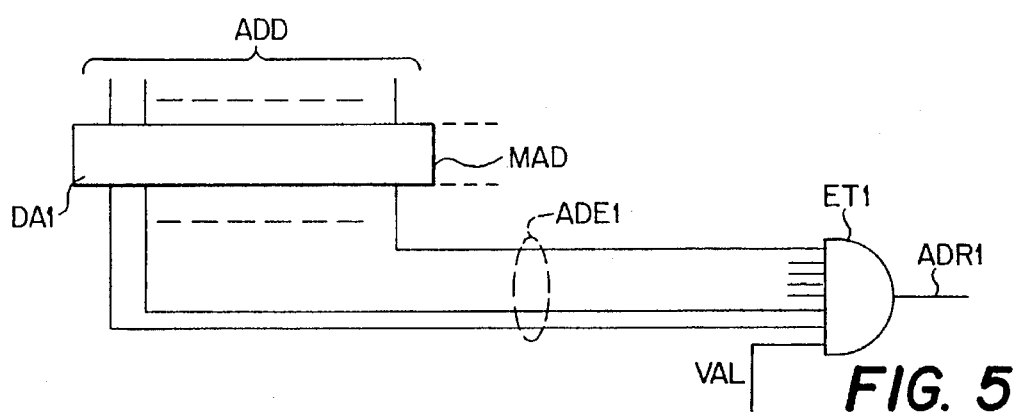

More specifically, FIG. 5 shows that a defective address memory MAD receives an address ADD. This memory MAD makes a bit-by-bit comparison of the address ADD and the defective address DA1 contained in the memory MAD1. This comparison is done by means of an Exclusive-OR logic gate (not shown) for example. The output of each comparison circuit is connected to an input of a coincidence circuit, the AND circuit ET1 in the example shown. If the two compared addresses are identical, the inputs of the circuit are at a logic level 1 and the circuit ET1 gives a command signal ADR1.

Furthermore, according to the invention, an additional input of the coincidence circuit ET1 receives an enable signal enabling the circuit ET1 to give the signal ADR1. When there is no enable signal VAL, as provided for in the invention, the AND circuit ET1 is inhibited and does not give any command signal ADR1.

Figure 1:
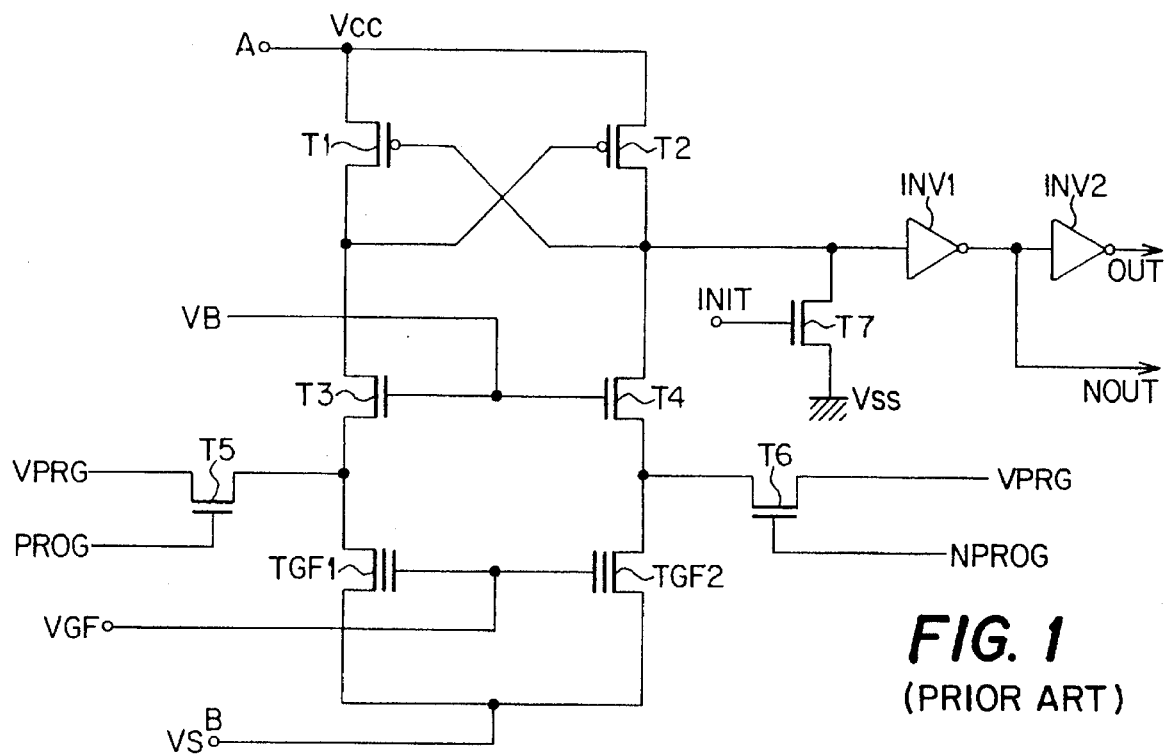
FIG. 1 shows a prior art memory addressing cell described here above.

The invention can be applied to an embodiment of a CAM of the kind shown in FIG. 1 and described here above. In this case, according to FIG. 6, a CAM corresponding to the memory MAD and to the circuit ET1 of FIG. 5 has, as an output circuit, the inverters INV2 of the different address bits of the memory MAD. An Exclusive-OR gate XOR or makes a comparison, by sets of two, of the main memory address bits ADD and defective address memory bits. Finally, a coincidence circuit, the circuit ET1 in the example shown, has its inputs connected to the outputs of the Exclusive-OR gates XOR of one and the same memory MAD. An additional input of the circuit ET1 receives the enable signal VAL.

Figure 6:
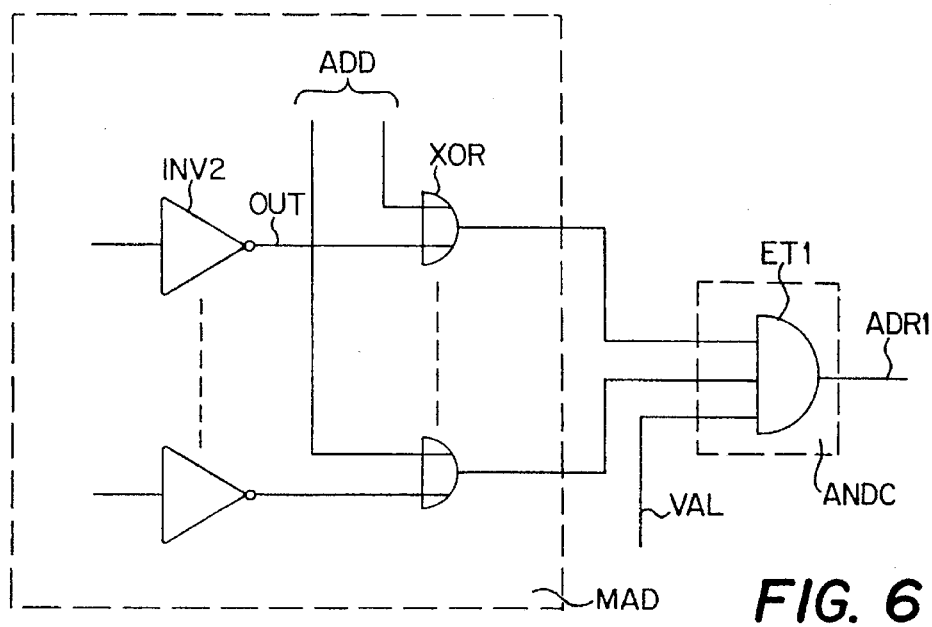
FIG. 6 shows an application of the invention to the memory circuit of FIG. 1.

In the exemplary embodiments of FIGS. 4 to 6, it is planned that the circuit IN will give an enable signal VAL that enables the working of the AND coincidence circuit ANDC. However, without going beyond the scope of the invention, and by providing for another type of logic, it is possible to use the inhibition signal INH to inhibit the working of the ANDC coincidence circuit or else to use the absence of the signal INH to permit the working of the ANDC coincidence circuit.

Figure 7:
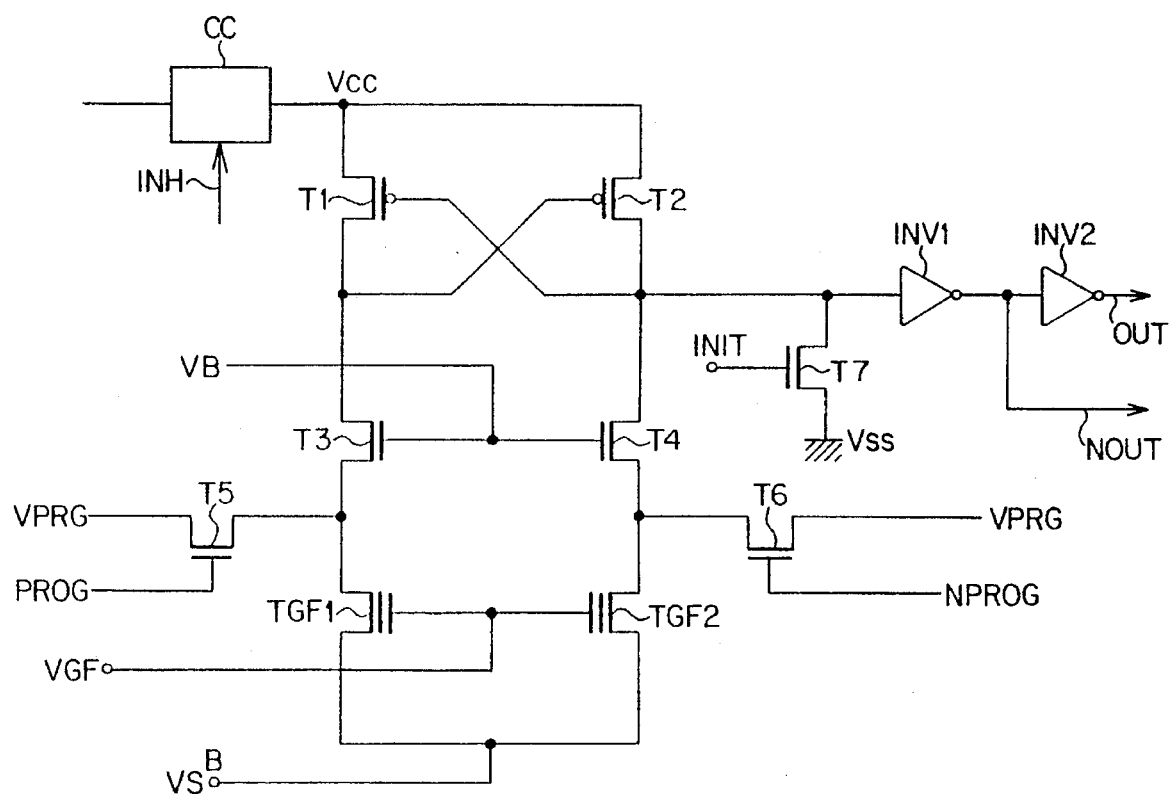
FIG. 7 shows an alternative embodiment of the invention applied by way of an example to the circuit of FIG. 1.
Figure 8:
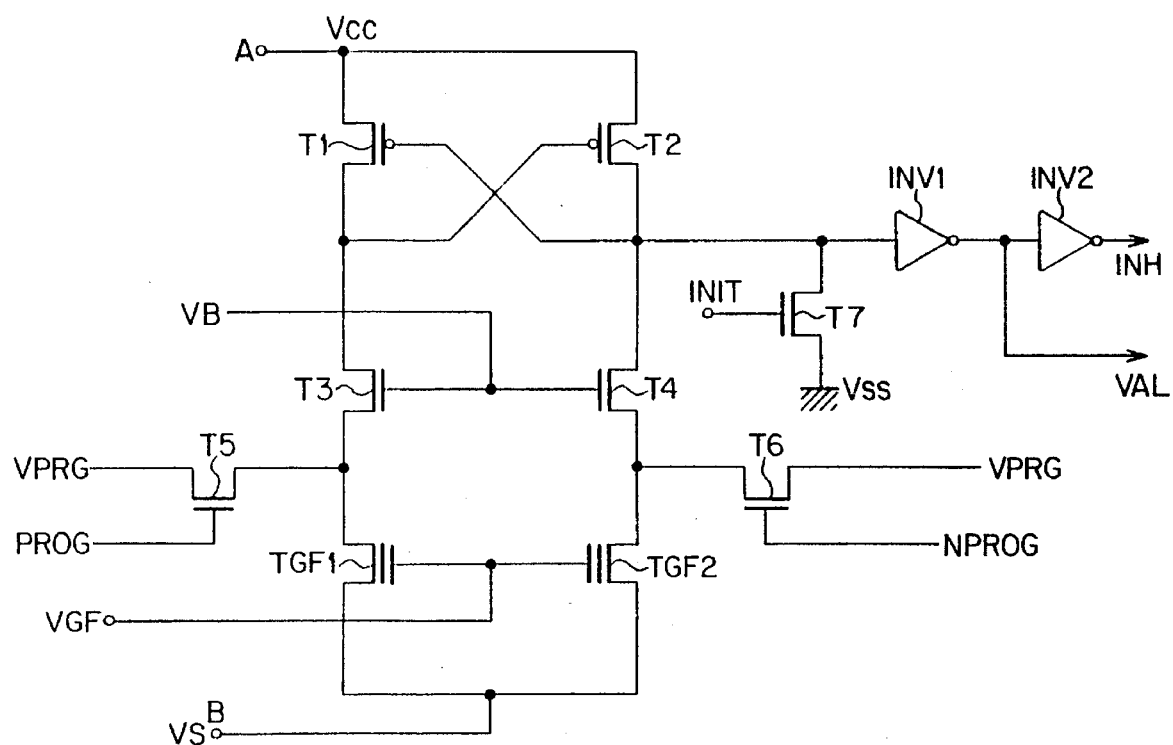
FIG. 8 shows a cell identical to that of FIG. 1, for generating signals INH and VAL.

According to an alternative embodiment, it is also planned to inhibit the working of the CAM by cutting off its electrical supply. Thus, in FIG. 7, there is provision for a supply cutoff circuit CC located on the supply wire of the potential Vcc. The circuit CC is controlled by the signal INH and interrupts the supply of the potential Vcc when it is decided to put the CAM out of circuit. Also according to the invention, the inhibition circuit is of the same type as the circuits of the CAM. For example, as shown in FIG. 8 it is made like the circuit of.

The method of the invention therefore consists in testing the main memory (MP). If no defect is detected, the inhibition circuit IN is placed in a situation such that it sends out the inhibition signal INH and no longer sends out the enable signal VAL.

The application of the inhibition signal INH or, conversely, of the signal VAL places the addressing circuit of the redundancy memory out of operation. This placing of the addressing circuit out of operation results either from the inhibition of the working of the CAM or from the prohibition of its operation.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

I claim:

1. A memory redundancy circuit for a main memory comprising several memory zones, each accessible by a memory address, this redundancy circuit comprising a redundancy memory addressable by a defective address memory that is designed to contain different defective addresses corresponding to defective zones of the main memory and that, at each operation for addressing of the main memory, compares a main memory address with each defective address to produce a comparison signal so that, in the event of concordance, it prohibits addressing of the main memory and addresses a zone of the redundancy memory, wherein said redundancy circuit comprises an inhibition circuit having at least a first state in which it gives a signal to the defective address memory to prohibit the defective address memory from issuing an output.

2. A circuit according to claim 1, wherein the inhibition circuit has a second state in which it enables the defective address memory to issue an output.

3. A circuit according to claim 1, wherein the inhibition circuit is a bistable circuit.

4. A circuit according to claim 1, wherein the defective address memory comprises an AND coincidence circuit receiving at least one comparison signal representing the comparison of a main memory address with a defective memory address, the signal of the inhibition circuit connected to the AND coincidence circuit to prohibit and to enable issuance of an output therefrom.

5. A circuit according to claim 4, wherein the AND coincidence circuit comprises a logic circuit performing one AND type logic function per address and possessing at least one input per comparison bit relating to the comparison of a defective address information element and an additional input for the signal of the inhibition circuit.

6. A circuit according to claim 5, comprising one coincidence circuit per defective address.

7. A circuit according to claim 1, wherein the defective address memory comprises: at least one circuit possessing two floating-gate transistors of the type that constitute a bistable flip-flop circuit whose state is defined by a programmed state of one of the transistors and is indicated by the state of an output connected to one of the group consisting of the drain and the source of one of the transistors, this output being connected to a comparison circuit furthermore receiving a main memory address information element and giving a comparison signal; and an AND coincidence circuit having its inputs connected to several outputs of comparison circuits to give a signal in the event of identity of a main memory address with a defective address, this coincidence circuit furthermore having an additional input to receive the signal of the inhibition circuit.

8. A circuit according to claim 1, wherein the inhibition circuit acts on an electrical supply circuit of the defective address memory to prohibit its operation.

9. A circuit according to claim 3, wherein the inhibition circuit comprises two floating-gate transistors of the type constituting a bistable flip-flop circuit whose state is defined by a programmed state of one of the transistors and is indicated by the state of an output connected to one of the group consisting of the drain and the source of one of the transistors and giving the inhibition signal or its reverse at this output.

10. A circuit according to any of the claims 1 to 9 wherein, after testing of the main memory, if the memory has no defect, the inhibition circuit inhibits the defective address memory from issuing an output.

11. A method for the initialization of a main memory that is provided with a redundancy memory accessible by means of a defective address circuit, according to which a test of the main memory is carried out wherein, if no defect is detected in the main memory, the defective address circuit is prohibited from issuing an output.

12. A memory redundancy circuit for a main memory comprising several memory zones, each accessible by a memory address, this redundancy circuit comprising a redundancy memory addressable by a defective address memory that is designed to contain different defective addresses corresponding to defective zones of the main memory and that, at each operation for addressing of the main memory, compares the main memory address with each defective address so that, in the event of concordance, it prohibits addressing of the main memory and addresses a zone of the redundancy memory, wherein said redundancy circuit comprises an inhibition circuit having at least a first state in which it gives an inhibition signal to the defective address memory to prohibit; wherein the defective address memory comprises at least one circuit possessing two floating-gate transistors of the type that constitute a bistable flip-flop circuit whose state is defined by a programmed state of one of the transistors and is indicated by the state of an output connected to one of the drain and the source of one of the transistors, this output being connected to a comparison circuit furthermore receiving a main memory address information element and giving a comparison signal; and an AND coincidence circuit having its inputs connected to several outputs of comparison circuits to give a signal in the event of identity of a main memory address with a defective address, this coincidence circuit furthermore having an additional input to receive the reverse of the inhibition signal.

13. A circuit according to claim 12, wherein the inhibition circuit acts on the electrical supply circuit of the defective address memory to prohibit its operation.

14. A circuit according to claim 12, wherein the inhibition circuit comprises two floating-gate transistors of the type constituting a bistable flip-flop circuit whose state is defined by the programming of one of the transistors and is indicated by the state of an output connected to one of the drain and the source of one of the transistors; and giving the inhibition signal or its reverse at this output.

15. A circuit according to any of the claims 12 to 14 wherein, after testing of the main memory, if the memory has no defect, the inhibition circuit inhibits operation of the defective address memory or makes it ineffective.

* * * * *